US009806496B2

(12) United States Patent
Hirao

(10) Patent No.: US 9,806,496 B2
(45) Date of Patent: Oct. 31, 2017

(54) SEMICONDUCTOR LASER ELEMENT

(71) Applicant: NICHIA CORPORATION, Anan-shi, Tokushima (JP)

(72) Inventor: Tsuyoshi Hirao, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 15/414,881

(22) Filed: Jan. 25, 2017

(65) Prior Publication Data

US 2017/0133822 A1    May 11, 2017

Related U.S. Application Data

(63) Continuation of application No. 14/925,648, filed on Oct. 28, 2015, now Pat. No. 9,590,389.

(30) Foreign Application Priority Data

Oct. 31, 2014  (JP) .................................. 2014-222958
Oct. 20, 2015  (JP) .................................. 2015-206304

(51) Int. Cl.
*H01S 5/04*  (2006.01)
*H01S 5/042*  (2006.01)
*H01S 5/22*  (2006.01)
*H01S 5/343*  (2006.01)

(52) U.S. Cl.
CPC .......... *H01S 5/0421* (2013.01); *H01S 5/0425* (2013.01); *H01S 5/22* (2013.01); *H01S 5/34333* (2013.01)

(58) Field of Classification Search
CPC ........ H01S 5/0425; H01S 5/0421; H01S 5/22; H01S 5/34333
See application file for complete search history.

(56) References Cited

U.S. PATENT DOCUMENTS

| 2004/0245537 A1 | 12/2004 | Kawakami et al. |
| 2006/0007976 A1 | 1/2006 | Watanabe et al. |
| 2010/0220762 A1 | 9/2010 | Harder et al. |
| 2010/0284434 A1 | 11/2010 | Koenig et al. |
| 2010/0308445 A1 | 12/2010 | Michiue et al. |

(Continued)

FOREIGN PATENT DOCUMENTS

| JP | 2000-114664 A | 4/2000 |
| JP | 2000-196181 A | 7/2000 |

(Continued)

OTHER PUBLICATIONS

Extended European Search Report of the correspoinding European Patent Application No. 15191797.8, dated Apr. 5, 2016.

*Primary Examiner* — Armando Rodriguez
(74) *Attorney, Agent, or Firm* — Global IP Counselors, LLP

(57) ABSTRACT

A semiconductor laser element includes a semiconductor stack with a ridge, a first electrode layer, a current injection prevention layer, and a second electrode layer. The semiconductor stack has an emission surface and a reflection surface. The first electrode layer extends in the lengthwise direction and disposed on the ridge in contact with the semiconductor stack. The current injection prevention layer partially covers the first electrode layer, and has one or more island portions. Each of the island portions is disposed in a center region of the ridge in plan view. The second electrode layer is disposed on the current injection prevention layer, and partially in contact with the first electrode layer.

9 Claims, 16 Drawing Sheets

(56) References Cited

U.S. PATENT DOCUMENTS

2013/0028280 A1   1/2013   Hongo et al.
2014/0204969 A1   7/2014   Masui et al.

FOREIGN PATENT DOCUMENTS

| | | |
|---|---|---|
| JP | 2003-174231 A | 6/2003 |
| JP | 2004-273955 A | 9/2004 |
| JP | 2005-167118 A | 6/2005 |
| JP | 2006-134943 A | 5/2006 |
| JP | 2010-034267 A | 2/2010 |
| JP | 2011-258883 A | 12/2011 |
| JP | 2013-225667 A | 10/2013 |

US 9,806,496 B2

SEMICONDUCTOR LASER ELEMENT

CROSS-REFERENCE TO RELATED APPLICATIONS

This application is a continuation application of U.S. patent application Ser. No. 14/925,648, filed on Oct. 28, 2015. This application claims priority to Japanese Patent Applications Nos. 2014-222958 and 2015-206304 filed on Oct. 31, 2014 and Oct. 20, 2015. The entire disclosures of U.S. patent application Ser. No. 14/925,648, Japanese Patent Application Nos. 2014-222958 and 2015-206304 are hereby incorporated herein by reference.

BACKGROUND OF THE INVENTION

The present invention relates to a semiconductor laser element.

Semiconductor laser elements have been used in a variety of applications in recent years. For instance, they have been used as a projector light source by connecting a plurality of them together in series.

In such applications of semiconductor laser elements, in the case where a single element becomes discontinuous, then even though the other semiconductor laser elements still allow electrical conduction, the electrical conduction of all of the serially connected semiconductor laser elements comes to a halt, so they no longer function as a light source. Therefore, to ensure long-term reliability of a light source in which semiconductor laser elements are used, it is necessary to avoid situations in which individual semiconductor laser elements become discontinuous.

Meanwhile, ways to maintain or improve the characteristics of individual semiconductor laser elements have been investigated in order to obtain a unimodal FFP in the horizontal direction for a semiconductor laser element, to suppress the concentration of current in a particular region and make the NFP more uniform, and/or to suppress the generation of leak current, etc. (JP2000-196181A, JP2004-273955A and JP2011-258883A, for example).

SUMMARY OF THE INVENTION

The object of the present disclosure provides a semiconductor laser element with which a discontinuous state of the semiconductor laser element can be avoided, and which can function efficiently even in the above-mentioned applications in which a plurality of elements are connected in series.

A semiconductor laser element according to one aspect includes a semiconductor stack with a ridge, a first electrode layer, a current injection prevention layer, and a second electrode layer. The semiconductor stack has an emission surface and a reflection surface. The first electrode layer extends in the lengthwise direction and disposed on the ridge in contact with the semiconductor stack. The current injection prevention layer partially covers the first electrode layer, and has one or more island portions. Each of the island portions is disposed in a center region of the ridge in plan view. The second electrode layer is disposed on the current injection prevention layer, and partially in contact with the first electrode layer.

According to the present disclosure, it is possible to provides a semiconductor laser element with which a discontinuous state of the semiconductor laser element can be avoided, and which can function efficiently even in the above-mentioned applications in which a plurality of elements are connected in series.

DETAILED DESCRIPTION OF THE INVENTION

Figure 1A:
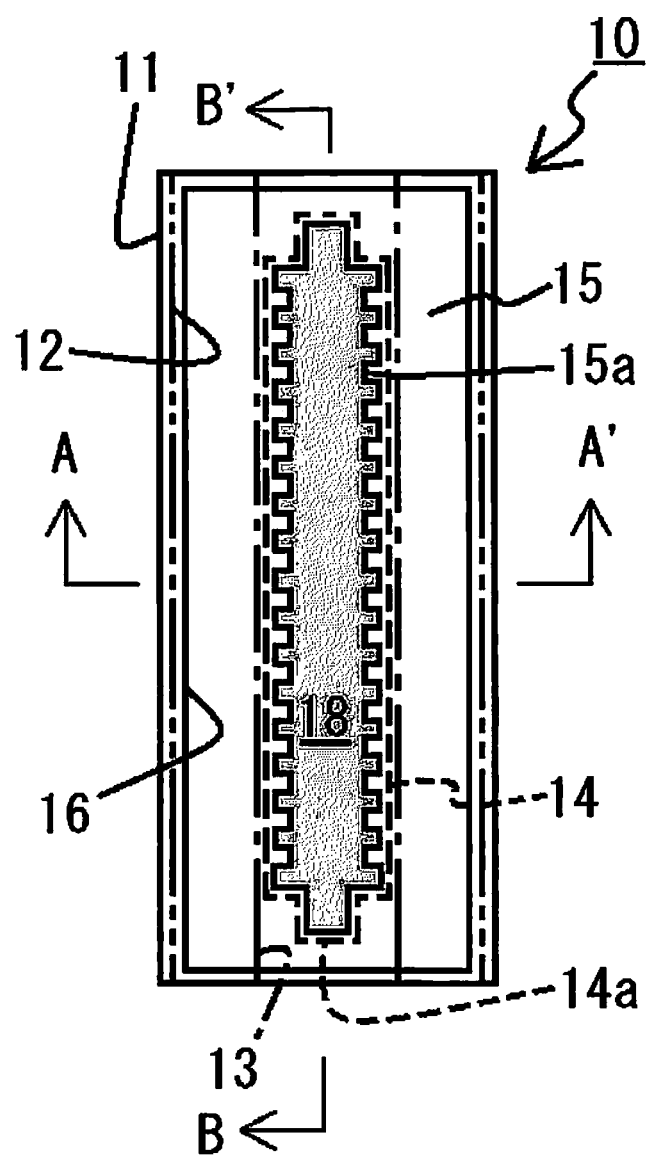
FIG. 1A is a schematic plan view of a semiconductor laser element according to an embodiment.
Figure 1B:
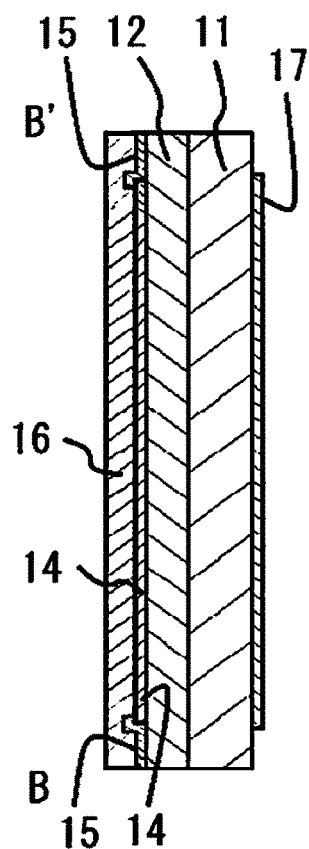
FIG. 1B is a cross sectional view along A-A' in FIG. 1A.

The inventors invested considerable effort in researching the above-mentioned phenomenon whereby a plurality of serially connected semiconductor laser elements become discontinuous, whereupon the arrived at the fact that there is a process that occurs in stages, up to the point of discontinuity.

First, when a plurality of semiconductor laser elements are connected in series and power is sent to these semiconductor laser elements, after an extended period of time one of the semiconductor laser elements stops laser oscillation and no longer lights up. In this state, the other serially connected semiconductor laser elements continue their laser oscillation and stay lit. With the unlit semiconductor laser element here, the pn junction deteriorates and there is leak current in the micro-current region.

When power continues to be sent to the unlit semiconductor laser element, local current concentration occurs at the leakage site, proceeding to failure of the semiconductor stack including the pn junction.

Then, when power continues to be sent to these semiconductor laser elements, at the unlit semiconductor laser element, physical failure of the semiconductor stack including the pn junction proceeds, and eventually the semiconductor laser element becomes discontinuous. Because of this, continuity stops in all of the serially connected semiconductor laser elements, and they no longer function as a light source.

In contrast, it was discovered that in order to avoid a state of discontinuity in the serially connected semiconductor laser elements, it is effective to ensure a region in each semiconductor laser element in which the semiconductor stack including the pn junction will not fail or is unlikely to fail, and to increase the size of this region as much as possible. Then, it was confirmed that when a semiconductor laser element becomes unlit and the other serially connected semiconductor laser elements are maintained in a lit state, the sites in the unlit semiconductor laser element that is prone to degradation or to failure are sites corresponding to the center and both sides of the optical waveguide in the semiconductor stack (a region of high optical density and/or a region of high current density, such as the active layer and the nearby area or the surface). And it was confirmed that when current is indirectly injected at these sites, degradation of the semiconductor stack including the pn junction can be suppressed, and physical failure can also be suppressed.

Semiconductor laser elements according to embodiments will be described below with reference to the accompanying drawings. While embodiments have been described below, it is to be understood that the description is merely exemplary and does not limit the invention as set forth in the appended claims in any way whatsoever. Further, constitutions described in examples and the embodiments can be employed in other examples and embodiments. The sizes and the arrangement relationships of the members in each of drawings are occasionally shown exaggerated for ease of explanation.

The semiconductor laser element in this embodiment mainly includes a semiconductor stack with a ridge formed on its surface, a first electrode layer that is disposed on the ridge, a current injection prevention layer that is disposed in contact with the first electrode layer, and a second electrode layer that is disposed on the current injection prevention layer. The semiconductor laser element also has a third electrode layer. The third electrode layer may be disposed on a surface of the semiconductor stack on the opposite side from the surface where the ridge is disposed, or it may be disposed on the same surface side as the first electrode layer by removing part of the semiconductor stack. The first electrode layer and second electrode layer are p electrodes, and the third electrode layer is an n electrode, for example.

Semiconductor Stack

The semiconductor stack is usually formed preferably by laminating a first conduction-type semiconductor layer, an active layer, and a second conduction-type semiconductor layer in that order. There are no particular restrictions on the types of these semiconductor layers, but examples include group III-V compound semiconductors and various other such semiconductors. More specifically, examples thereof include a gallium nitride-based semiconductor material such as $In_XAl_YGa_{1-X-Y}N$ ($0 \leq X$, $0 \leq Y$, $X+Y \leq 1$), for example, AlN, GaN, InGaN, AlGaN, InGaAlN, and the like can be used. A known a thickness or a stacked structure of each layer in the art can be used.

The semiconductor stack particularly preferably have a light guide layer in the first conduction-type semiconductor layer (such as an n-type layer) and/or the second conduction-type semiconductor layer (such as a p-type layer), and even more preferable for this light guide layer to be an SCH (Separate Confinement Heterostructure), which is a structure in which the active layer is sandwiched between the light guide layers. The light guide layer of the first conduction-type semiconductor layer and the light guide layer of the second conduction-type semiconductor layer may be structures with mutually different compositions and/or film thickness.

The active layer may be a multiple quantum well structure or a single quantum well structure. A well layer of the active layer preferably has a general formula of $In_xAl_yGa_{1-x-y}N$ ($0<x \leq 1$, $0 \leq y<1$, $0<x+y \leq 1$) that contains at least indium. This layer can emit light in a wavelength band of about 300 to 650 nm, for example.

Examples of the method of forming the semiconductor stack include any method known as growth method of a semiconductor such as a nitride semiconductor and the like such as MOVPE (metal organic vapor phase epitaxy), MOCVD (metal organic chemical vapor deposition), HVPE (hydride vapor phase epitaxy), MBE (molecular beam epitaxy) etc. In particular, MOCVD is preferable because it can be crystallized with good growth under a condition of reduced pressure or atmospheric pressure.

The semiconductor stack is usually formed on a substrate. Examples of the materials of the substrate include sapphire, silicon carbide, silicon, ZnSe, ZnO, GaAs, diamond, nitride semiconductors (GaN, AlN, etc.) and the like.

The thickness of the substrate is about 50 μm to 1 mm, for example. The substrate is preferably a nitride semiconductor substrate having an off angle of about 0.03 to 10° on its first main surface and/or second main surface. The substrate may have texturing in the form of a lattice, stripes, or island portions on its surface. The substrate can be one in which the dislocation density and/or polarity is distributed substantially uniformly, one in which the dislocation density is distributed periodically in stripes in-plane, and/or one in which regions of different polarity are distributed, etc.

Different crystal growth surfaces may be distributed over the surface of the substrate. For instance, two or more crystal growth surfaces such as a (0001) surface, a (000-1) surface, a (10-10) surface, a (11-20) surface, a (10-14) surface, a (10-15) surface, or a (11-24) surface may be distributed. In the case where GaN is used as the substrate, a (0001) surface is typically used as the crystal growth surface.

Furthermore, a buffer layer, an intermediate layer (such as $Al_xGa_{1-x}N$ ($0 \leq x \leq 1$)) or the like may be formed on the substrate prior to forming a semiconductor stack that functions as a semiconductor laser element.

The semiconductor stack has an optical waveguide region in its interior. The optical waveguide region constitutes a cavity along with the laser beam reflection surface and emission surface. Accordingly, the semiconductor stack is formed in a quadrangular shape in plan view, and preferably in a rectangular shape.

Ridge

A ridge is formed on the surface of the semiconductor stack, such as on the surface of the second conduction-type semiconductor layer. The ridge has the function of demarcating an optical waveguide region under it and in the active layer (the optical waveguide region may also include the light guide layers). Accordingly, the ridge is disposed in a striped shape that extends in the cavity direction of the semiconductor laser element. The cavity direction will hereinafter sometimes be called the lengthwise direction.

The width of the ridge is about 1 to 100 µm, for example. With a multiple transverse mode semiconductor laser element, the width is preferably about 10 to 100 µm, with 15 to 80 µm being more preferable, and 20 to 70 µm being even better.

In general, a multiple transverse mode semiconductor laser element has a wide optical waveguide region (known as a wide stripe), so COD (Catastrophic Optical Damage) can be better suppressed by a decrease in current density. Also, with a wide stripe laser element, when the contact surface area with the electrodes increases, voltage decreases and there is a smaller voltage differential in the cavity length direction, so current concentration is less apt to occur, and sudden decreases in optical output can be reduced. Therefore, with a multiple transverse mode semiconductor laser element, not only COD but also sudden decreases in optical output can be suppressed.

The height of the ridge can be suitably adjusted according to the material, film thickness, and so forth of the layer constituting the second conduction-type semiconductor layer, but is 0.1 to 2 µm, for example. The ridge is preferably set so that its length in the direction in which the cavity of the semiconductor laser element extends is about 100 to 2000 µm. The ridge need not have the same width over the entire direction in which the cavity extends. The side surfaces of the ridge may be vertical, or they may be tapered at an angle of about 60 to 90°. In other words, the distance between edges of the ridge upper surface may be less than the distance between edges of the ridge bottom part (that is, the bottom surface of the ridge).

The ridge is preferably formed so as to be disposed perpendicular to the cavity surface. This allows the cavity surface to serve as a favorable light emission surface and light reflection surface.

The ridge can be formed by a method that is known in this field, such as a method in which a mask pattern is formed on a semiconductor stack, and this mask pattern is used for etching.

First Electrode Layer

The first electrode layer is disposed on the ridge, and is typically in ohmic contact, at a sufficiently low contact resistance, with the semiconductor stack constituting the ridge. The first electrode layer has a shape that extends in the direction in which the ridge extends, that is, in the lengthwise direction. As long as it is disposed on the ridge, the first electrode layer may be cover the side surfaces of the ridge, but it is preferable that it is disposed only between the two edges of the ridge. In other words, part of the outer edges of the first electrode layer may be disposed in a region outside the ridge or on the ridge side surfaces, but preferably all of the outer edges of the first electrode layer is disposed on the ridge. This disposition allows the carrier to be limited to under the ridge, so light can be confined under the ridge.

The first electrode layer may not go all the way to the emission surface and reflection surface of the semiconductor laser element. That is, the first electrode layer may be separated from the emission surface and reflection surface in plan view. This separation distance may be the same on both the emission surface side and the reflection surface side, or may be different. For example, it is preferable that the separation distance on the emission surface side of the first electrode layer is equal to the separation distance on the reflection surface side. Also, the edges of the first electrode layer on the emission surface side and the reflection surface side may be parallel to the emission surface or the reflection surface of the semiconductor laser element, or the shape may be such that a part sticks out toward the emission surface or the reflection surface.

The first electrode layer can be formed by a single-layer film or a stacked film of, for example Au, Pt, Pd, Rh, Ni, W, Mo, Cr, Ti, Cu, Ag, Zn, Sn, In, Al, Ir, Rh, Ru, ITO or alloy thereof. Examples of the layer include Ni/Au, Ni/Au/Pt, Ni/Au/Pd, Rh/Pt/Au, Ni/Pt/Au from the semiconductor layer side. The film thickness may be that of any film used in this field. For instance, the thickness of the first electrode layer is preferably from 5 nm to 2 µm, more preferably from 50 nm to 500 nm, and still more preferably from 100 nm to 300 nm.

Current Injection Prevention Layer

The current injection prevention layer covers at least part of the first electrode layer.

In one embodiment, the current injection prevention layer covers part of the upper surface of the first electrode layer. In another embodiment, the current injection prevention layer covers at least part of the upper surface from the side surfaces of the first electrode layer (such as the side surfaces that extend in the lengthwise direction).

The current injection prevention layer preferably covers the surface of the semiconductor stack on both sides of the ridge, and covers the ridge side surfaces from the side surfaces of the first electrode layer that extend in the lengthwise direction. Providing the current injection prevention layer in this way serves as an embedding film for embedding both sides of the ridge, and insulates the semiconductor stack and the second electrode layer that is subsequently formed. In this case, the current injection prevention layer is disposed on the surface of the semiconductor stack so as not to come into direct contact with the second electrode layer (discussed below). An insulating film can also be provided to function as an embedding film that is separate from the current injection prevention layer, but preferably the current injection prevention layer is disposed to the outside of the ridge so as to function as an embedding film. This reduces the number of steps entailed. Also, the current injection prevention layer is formed in a larger surface area, which prevents the current injection prevention layer from separating from the semiconductor stack.

In other words, the current injection prevention layer can have a shape that covers substantially the entire region of one surface of the semiconductor stack including the ridge, and that has an opening to expose part of the first electrode layer on the ridge. This opening becomes a contact site with the second electrode layer (discussed below), and serves as a current injection region.

The current injection prevention layer is preferably disposed on the outer periphery portion of the first electrode layer at a specific width, and to expose the first electrode layer at other locations. The "outer periphery portion" here may be all of the outer periphery of the first electrode layer or just part of it. In other words, the outer periphery portion may be near all or part of both edges in the lengthwise direction, or may be only near the two edges in the short-side direction and both edges in the lengthwise direction. There are no particular restrictions on the specific width, which may be about 0.1 to 5 μm, with about 0.5 to 3 μm being preferable. The width may vary all around the outer periphery portion, but it is preferably the same. In the case where the current injection prevention layer has a protrusion portion to be described, this numerical value range is preferable in the portions other than the protrusion portion.

In one embodiment, it is preferable that the current injection prevention layer is in contact with the first electrode over 18 to 80% of the contact surface area between the first electrode layer and the semiconductor stack (in Embodiment 1, etc., below, the same as the planar surface area of the first electrode layer). In other words, the current injection prevention layer is preferably disposed over 18 to 80% of the planar surface area of first electrode layer disposed on the ridge, with 18 to 60% being more preferable, and 18 to 50% being still more preferable. The "planar surface area of the first electrode layer" refers to the surface area of the first electrode layer in plan view (when viewed from the upper surface side of the first electrode layer). In the case where the first electrode layer extends to outside the ridge via an insulating embedding film or the like, the contact surface area between the first electrode layer and the semiconductor stack is used as a reference, and the current injection prevention layer is preferably disposed on the first electrode layer in the above-mentioned ratio to this reference.

In another embodiment, regardless of the contact surface area with the first electrode layer, the current injection prevention layer preferably has an island portion disposed in the center region of the ridge and/or a protrusion portion that extends from both edges of the first electrode layer toward the center region of the ridge, in plan view. "Both edges of the first electrode layer" here are the outer edges that extend in the lengthwise direction on both sides of the first electrode layer. That is, they are the outer edges running along the side surfaces of the ridge. The "center region" refers to the region that is to the inside of the side surfaces and the edges.

There are no particular restrictions on the shape of the current injection prevention layer that covers the first electrode layer, but a shape that covers the easily damaged region of the semiconductor stack including the above-mentioned pn junction (hereinafter also referred to as the failure region) from above is preferable in order to prevent the injection of current into the first electrode layer present above the failure region. Here, it is possible that the failure region will be a region with high optical density, a region with high current density, etc., so examples include the center region of the optical waveguide and the region near both ends of the ridge bottom. Therefore, when a region that can prevent current injection into these regions, that is, the site of the first electrode layer disposed above these regions, is covered by the current injection prevention layer, then the injection of current into these regions can be reduced. As a result, optical density and/or current density can be reduced in the failure region, and discontinuity can be prevented.

The following are plan view examples of the shape of the current injection prevention layer.

(a) A shape in which the side surfaces extending in the lengthwise direction of the first electrode layer are covered, and the area near both edges extending in the lengthwise direction of the first electrode layer is covered.

(b) A shape that extends from both edges extending in the lengthwise direction of the first electrode layer, toward the center region of the ridge (hereinafter also referred to as a protrusion portion).

(c) A shape disposed in the center region of the ridge (hereinafter also referred to as an island portion).

The current injection prevention layer may have just one of these shapes, or it may have a combination of two or more shapes.

The "near both edges" in (a) will depend on the width of the ridge, the amount of current and/or voltage applied to the semiconductor laser element, and other factors, but an example is a width of about 2 to 30% the width of the first electrode layer from the edge of the first electrode layer, and a width of about 5 to 20% is preferable. When the layer is provided in the same width on both edges, the surface area on the first electrode layer accounted for by the current injection prevention layer will be double. The shape in which the layer covers near both edges may be a shape that is continuous over the entire length in the lengthwise direction of the first electrode layer, or may be a shape that is divided up. Therefore, it may be a shape that covers only part in the lengthwise direction of the first electrode layer.

The phrase "extending toward the center region of the ridge" in (b) refers that the layer having a width of about 5 to 50% of the width of the first electrode layer from the edge of the first electrode layer, and a width of about 8 to 50% is preferable. In the case where the layer extends in the same width from both edges, the surface area on the first electrode layer accounted for by the current injection prevention layer will be double. The protrusion portion is provided in a shape that extends toward the center region of the ridge more than the portion provided at a substantially constant width near both edges in (a). The protrusion portion may be such that protrusion portions extending from both edges link together and go from one edge toward the other edge in the lengthwise direction, in the center region of the ridge. The protrusion portion may have a shape that is continuous over the entire length of the first electrode layer in the lengthwise direction, or may be in a segmented shape. Therefore, the shape of the current injection prevention layer may cover only part of the first electrode layer in the lengthwise direction. As to the length of the protrusion portion (the length along the lengthwise direction of the first electrode layer), in the case where one protrusion portion extends from each of the two sides, the length of the protrusion portion on one side is preferably about 70 to 95% of the length of the first electrode layer, and in the case where a plurality of protrusion portions extended from each side, the total length on one side is preferably a length that is about 30 to 70% of the length of the first electrode layer. In the case where the first electrode layer has an electrode protrusion portion, it is preferable not to provide protrusion portions extending from the side surfaces of the first electrode layer (this is not in the lengthwise direction), and preferable to provide only protrusion portions extending from both edges (in the lengthwise direction, for examples) of the first electrode layer.

The phrase "disposed in the center region of the ridge" in (c) means that there is a portion disposed as a so-called island portion, away from the portion covering the side surfaces of the first electrode layer of the current injection prevention layer. The width of this island portion is, for example, about 5 to 90% of the width of the first electrode layer, and a width of about 40 to 80% is preferable. There may be just one island portion, or two or more. In the case where there are two or more, the island portions can be disposed in a line along the lengthwise direction of the first electrode layer. The island portion may have a shape that is continuous over the entire length of the first electrode layer in the lengthwise direction, or may have a segmented shape. Therefore, it may be a shape that covers only part of the first electrode layer in the lengthwise direction. The length of the island portion (the length along the lengthwise direction of the first electrode layer) when there is just one island portion is preferably a length of about 70 to 95% of the length of the first electrode layer, and when there are two or more island portions, their total length is preferably a length of about 30 to 70% of the length of the first electrode layer.

In the case where a plurality of protrusion portions and/or island portions are provided, they are preferably spread out substantially uniformly in the lengthwise direction of the first electrode layer. In the case where the first electrode layer has an electrode protrusion portion as in Embodiment 1 (discussed below), etc., the layout spacing may be changed for just the portion closest to the electrode protrusion portion. There may be 10 or more protrusion portions and/or island portions, or 50 or more may be provided.

The specific shape of the current injection prevention layer includes the following examples.

(i) A shape in which the protrusion portion of the current injection prevention layer is divided up into a plurality of parts in the lengthwise direction.

(ii) A shape in which the island portion of the current injection prevention layer extends in the lengthwise direction in the center region of the ridge in plan view.

(iii) A shape in which the protrusion portion of the current injection prevention layer is divided up into a plurality of parts in the lengthwise direction, and the island portion is divided up into a plurality of parts in the lengthwise direction in between protrusion portions on one edge of the first electrode layer and in the center region of the ridge.

(iv) A shape in which the protrusion portion of the current injection prevention layer extends from one edge of the first electrode layer to the other edge in plan view, and is divided up into a plurality of parts in the lengthwise direction.

The current injection prevention layer is preferably an insulating layer. Also, the current injection prevention layer is preferably formed from a material that has a lower refractive index than that of the semiconductor stack so that light can be more readily confined in the ridge. The current injection prevention layer can be formed, for example, from one or more layers that include an oxide, a nitride, or an oxynitride of silicon, zirconium, aluminum, or tantalum. There are no particular restrictions on the thickness of the layer, as long as it is thick enough to reduce or prevent current injection into the semiconductor stack, but an example is a range of about 0.01 to 1 μm.

The current injection prevention layer can be formed by a method known in this field, in which a film is formed at the desired location and patterned into the desired shape.

Second Electrode Layer

The second electrode layer is ultimately connected to the outside as a so-called pad electrode, and is disposed over the first electrode layer with the current injection prevention layer in between. The second electrode layer comes into contact with the first electrode layer through an opening in the current injection prevention layer. That is, the current injection prevention layer is locally present between the first electrode layer and the second electrode layer. The second electrode layer is preferably disposed in direct contact with the first electrode layer over a surface area of 20 to 82% of the contact surface area between the first electrode layer and the semiconductor stack (the same as the planar surface area of the first electrode layer in Embodiment 1 (discussed below), etc.), and more preferably a surface area of 40 to 82%, with a surface area of 50 to 82% being particularly preferable. As discussed above, this layout reduces the current injection density to the first electrode layer in the portion where the current injection prevention layer is present, when current is injected through the second electrode layer due to partial contact with the first electrode layer. As a result, optical density and current density in the semiconductor stack corresponding to the above-mentioned failure region can be reduced, physical failure of these can be reduced, and a state of discontinuity can be avoided. Meanwhile, because the first electrode layer is present under the current injection prevention layer, the extreme decrease in power conversion efficiency attributable to a limiting of the current injection region can be suppressed.

The second electrode layer may be disposed only over the first electrode layer, or it may be disposed via the current injection prevention layer or another insulating film over the semiconductor stack disposed on both sides of the ridge from over the first electrode layer. Also, the second electrode layer may be separated from the emission surface and the reflection surface in plan view. This separation distance may be the same on both the emission surface side and the reflection surface side, or may be different. For example, the edges on the emission surface side and the reflection surface side of the second electrode layer may be disposed more to the inside (the side farther away from the emission surface and the reflection surface) than the edges on the emission surface side and the reflection surface side of the first electrode layer, but are preferably disposed on the outside (the side closer to the emission surface and the reflection surface). The edges of the second electrode layer on the emission surface side and the reflection surface side may have a shape that sticks out toward the emission surface or the reflection surface. The edges are preferably parallel to the emission surface or the reflection surface.

The second electrode layer can be formed, for example, by selecting the same material as the one constituting the first electrode layer. For example, a stacked film made of a metal such as Ni, Ti, Au, Pt, Pd, W, Rh or the like is preferred. Specifically, examples of the stacked film include W/Pd/Au, Ni/Ti/Au, Ni/Pd/Au, and Ni/Pd/Au/Pt/Au stacked in this order. The outermost surface of the second electrode layer preferably contains gold. There are no particular restrictions on the thickness of the second electrode layer serving as a pad electrode, but the thickness of the gold film in the final layer is preferably at least about 100 nm. The total thickness of the second electrode layer is preferably 0.3 to 3 μm, for example, and more preferably 0.5 to 2 μm.

Third Electrode Layer

The third electrode layer may be disposed on the surface of the semiconductor stack that is on the opposite side from the surface where the ridge is disposed in the semiconductor laser element, or may be disposed on the same surface side as the first electrode layer by removing part of the semiconductor stack. In the case where a conductive material is used as the substrate, the third electrode layer can be provided to the lower surface of the substrate (the surface on the opposite side from the surface where the semiconductor stack is provided).

The third electrode layer can be formed by using the same material as the first electrode layer or the second electrode layer.

Production Method

The above-mentioned semiconductor laser element can be formed by any method that is known in this field. Also, an additional protective film and/or insulating film, electrode layer, etc., may also be formed if desired.

The semiconductor laser element preferably has a cavity surface formed by a surface selected from the group consisting of the M surface (1-100), A surface (11-20), C surface (0001), or R surface (1-102), for example. With a nitride semiconductor laser element of a hexagonal crystal system, typically the M surface can be used as the cavity surface.

Embodiment 1

Figure 3:
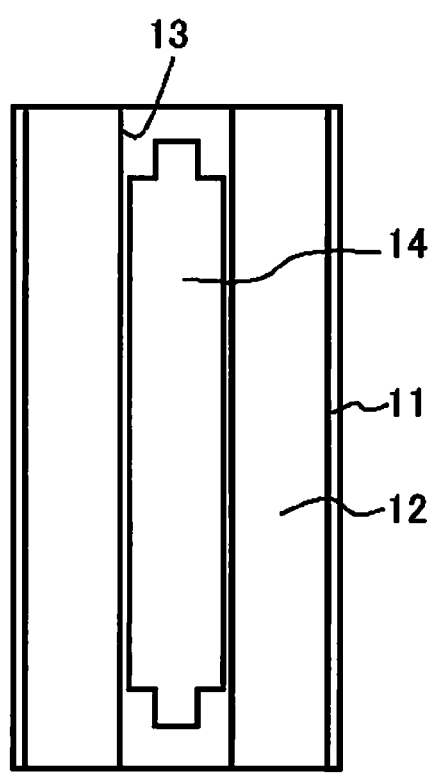
FIG. 3 is a schematic plan view of a semiconductor laser element in which the current injection prevention layer and the second electrode layer have been removed from the semiconductor laser element of FIG. 1A.

As shown in FIGS. 1A to C and 3, with a semiconductor laser element 10 in Embodiment 1, a semiconductor stack 12 is stacked on a substrate 11, and a ridge 13 is formed on the surface of the semiconductor stack 12. FIG. 3 is a schematic plan view of the semiconductor laser element 10 in which only a first electrode layer 14 has been formed on the ridge 13, that is, in which a current injection prevention layer 15 and a second electrode layer 16 have been removed from FIG. 1A. Forming the current injection prevention layer 15 and the second electrode layer 16 over this results in the semiconductor laser element 10 shown in FIG. 1A.

The semiconductor laser element 10 has a plan view shape that is rectangular, measuring 1200 µm×150 µm, and the surface obtained by cleaving at the M surface serves as the cavity surface.

Specific examples of the dimensions and materials used in Embodiment 1 were given above, but these are just examples and do not limit the present invention. The same applies for subsequent embodiments.

The substrate 11 is formed from n-type GaN.

The semiconductor 12 includes on the substrate 11; Si-doped GaN layer (thickness of 10 nm); Si-doped $Al_{0.02}Ga_{0.98}N$ layer (thickness of 1.6 µm); Si-doped GaN layer (thickness of 10 nm); Si-doped $In_{0.05}Ga_{0.95}N$ layer (thickness of 0.15 µm); Si-doped GaN layer (thickness of 10 nm); lower cladding layer made of Si-doped $Al_{0.07}Ga_{0.93}N$ (thickness 0.9 µm); lower guide layer made of Si-doped GaN (thickness of 0.3 µm); MQW active layer; Mg doped $Al_{0.12}Ga_{0.88}N$ layer (thickness of 1.5 nm); Mg doped $Al_{0.16}Ga_{0.84}N$ layer (thickness of 8.5 nm); upper guide layer made of undoped $Al_{0.04}Ga_{0.96}N$ layer (thickness of 1.5 µm) and Mg doped $Al_{0.04}Ga_{0.96}N$ (thickness of 0.15 µm); upper cladding layer made of Mg doped GaN (thickness of 15 nm), which are stacked in this order.

The MQW layer includes barrier layers and well layers. The MQW layer includes undoped $In_{0.03}Ga_{0.97}N$ layer (thickness of 250 nm); Si-doped GaN layer (thickness of 10 nm); undoped $In_{0.15}Ga_{0.85}N$ layer (thickness of 3 nm); undoped GaN (thickness of 3 nm); undoped $In_{0.15}Ga_{0.85}N$ layer (thickness of 3 nm) and a composition gradient layer that changes from undoped $In_{0.05}Ga_{0.95}N$ to GaN (thickness of 250 nm), which are stacked in this order from the substrate side.

The ridge 13 is formed as a stripe having a width of 50 µm. It is deep enough to expose an upper guide layer. The ridge 13 can be formed, for example, by photolithography or RIE etching.

Figure 1C:
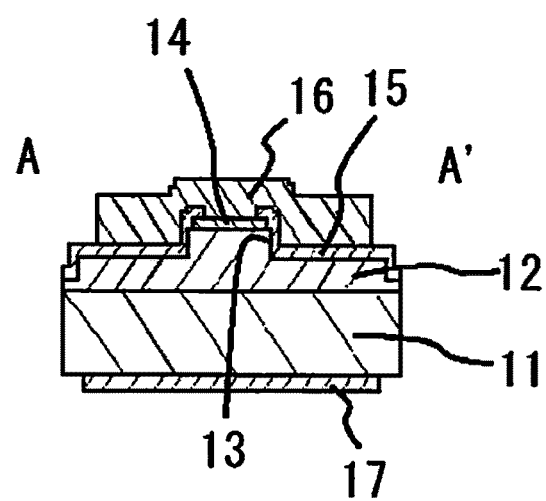
FIG. 1C is a cross sectional view along B-B' in FIG. 1A.

The side surfaces of the semiconductor laser element 10 are provided with a step that goes to the semiconductor stack 12 (such as an n-type semiconductor layer) (see FIG. 1C). However, the step may be provided to go to the substrate 11, or no step may be provided.

Figure 2:
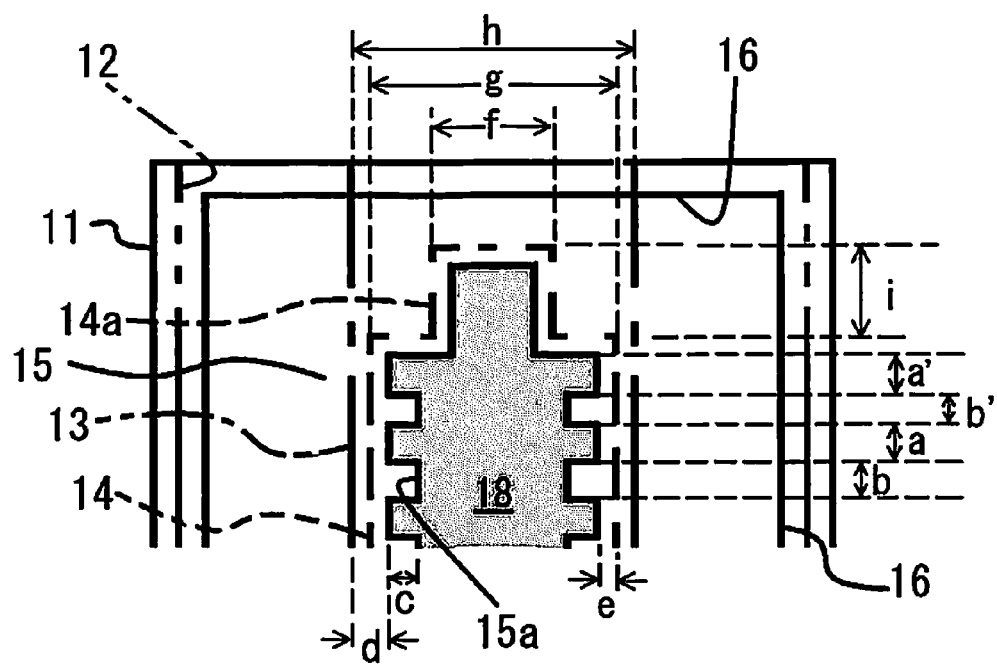
FIG. 2 is an enlarged detail view of FIG. 1A.

As shown in FIG. 2, the first electrode layer 14 (p electrode) composed of ITO is formed over the ridge 13 in a thickness of 200 nm and an electrode width g (such as 47 µm) that is slightly less than the width h of the ridge 13. The first electrode layer 14 has a shape which extends in the lengthwise direction. The first electrode layer 14 has electrode protrusion portions 14a that extend toward the emission surface and the reflection surface in the center of the ends on the emission surface side and the reflection surface side, and these are disposed so as to be separated from the emission surface and the reflection surface, respectively. The width f of the electrode protrusion portions 14a is 25 µm, their length i is 30 µm, and the total length of the first electrode layer is 1166 µm.

The current injection prevention layer 15, which is composed of $SiO_2$, is disposed over the first electrode layer 14. The first electrode layer 14 is 200 nm thick. In other words, the current injection prevention layer 15 is formed over substantially the entire surface of the semiconductor stack 12 including the ridge 13, and has an opening over the first electrode layer 14, and the inside of this opening serves as a current injection region 18.

The current injection prevention layer 15 covers the upper surface near the edge of the first electrode layer 14 from the side surfaces of the first electrode layer 14 (the distance e from the edge of the first electrode layer 14 is 1.5 µm, and the distance d from the edge of the ridge 13 is 3 µm), and continuously covers the side surfaces of the ridge 13 and the entire upper surface of the semiconductor stack 12. The outer edges of the current injection prevention layer 15 coincide with the outer edges of the semiconductor stack 12.

The current injection prevention layer 15 has protrusion portions 15a that extend toward the center region of the ridge 13 from both edges extending in the lengthwise direction of the first electrode layer. The protrusion portion is divided up into a plurality of parts in the lengthwise direction. The protrusion portions 15a protrude by a width c (6 µm) from the end of the upper surface of the current injection prevention layer 15 covering the area near the edge of the first electrode layer 14. Therefore, the current injection prevention layer 15 covers the ridge 13 and the first electrode layer 14 at a width of 9 µm from the edge of the ridge 13 at the protrusion portions 15a.

The protrusion portions 15a of the current injection prevention layer 15 are spaced apart by a spacing a of about 10 µm, and have a length b of about 10 µm. However, at the very end in the lengthwise direction, the spacing a' is 8 µm, and the length b' is 8.5 µm.

This current injection prevention layer 15 is in contact with the first electrode layer 14 at 19.1% of the planar surface area of the first electrode layer 14.

The second electrode layer 16 is disposed over the current injection prevention layer 15. The second electrode layer 16 is in contact with part of the first electrode layer 14 and is formed so as to cover the upper surface of the ridge 13, the side surfaces of the ridge 13, and the upper surface of the semiconductor stack 12. Therefore, the first electrode layer 14 and the second electrode layer 16 are in contact at the current injection region 18, which allows current to be injected from the second electrode layer 16, through the first electrode layer 14, to the semiconductor stack 12.

The second electrode layer 16 is formed, for example, by laminating films consisting of a nickel layer (8 nm thick), a palladium layer (200 nm thick), a gold layer (400 nm thick), a platinum layer (200 nm thick), and a gold layer (700 nm thick) in that order starting from the semiconductor stack 12 side. The second electrode layer 16 is disposed over the ridge 13 up to near the end on the short side of the semiconductor stack 12 (the cavity surface), and the edge of the second electrode layer 16 is disposed closer to the center region than the edge on the long side of the semiconductor stack 12. Also, it is disposed so that the edges are deviated from the four corners of the semiconductor laser element 10.

The substrate 11 is about 80 µm thick. A third electrode layer 17 composed of a titanium layer (6 nm thick), a platinum layer (200 nm thick), and a gold layer (300 nm thick), starting from the substrate 11 side, is formed on the rear surface of the substrate 11.

The semiconductor laser element 10 has an $Al_2O_3$ film formed as an emission-side mirror in a thickness of 137 nm on the emission surface of the cavity. The semiconductor laser element 10 has an $Al_2O_3$ film (137 nm thick) and a $Ta_2O_5$ (52 nm thick) film formed as a reflection surface mirror on the reflection surface of the cavity, has a total of six pairs of a $SiO_2$ film (76 nm thick) and a $Ta_2O_5$ film (52 nm thick) formed over this, and then has a $SiO_2$ film (153 nm thick) formed on this.

This semiconductor laser element 10 is usually mounted face-down on a support member using a connecting member (AuSn eutectic solder, etc.). The support member has a base composed of SiC, and a conduction layer composed of Ti/Pt/Au/Pt (with a titanium layer on the base side) formed over the base.

As discussed above, with the semiconductor laser element in this embodiment, since current is injected into the semiconductor stack by a current injection region 18 having a particular shape, degradation of pn junctions and other places that are susceptible to degradation when current flows for an extended period of time can be reduced, and the occurrence of leak current in the micro-current region can be effectively suppressed. Consequently, even when a semiconductor laser element is subjected to sustained current flow, local current concentration that occurs at leakage sites can be reduced, and failure of the semiconductor stack including pn junctions can be suppressed. As a result, physical failure of the semiconductor stack including pn junctions can be prevented or avoided, and discontinuity of the semiconductor laser element can also be prevented. In particular, when a plurality of semiconductor laser elements are connected in series, discontinuity of the individual semiconductor laser elements can be prevented, so discontinuity of all the semiconductor laser elements is also prevented.

Also, the structure for suppressing the above-mentioned discontinuity can be to supply sufficient electrical power without adversely affecting the oscillation of the semiconductor laser element, and the decrease in power conversion efficiency can be suppressed, as shown in the evaluation discussed below.

Embodiment 2

Figure 4:
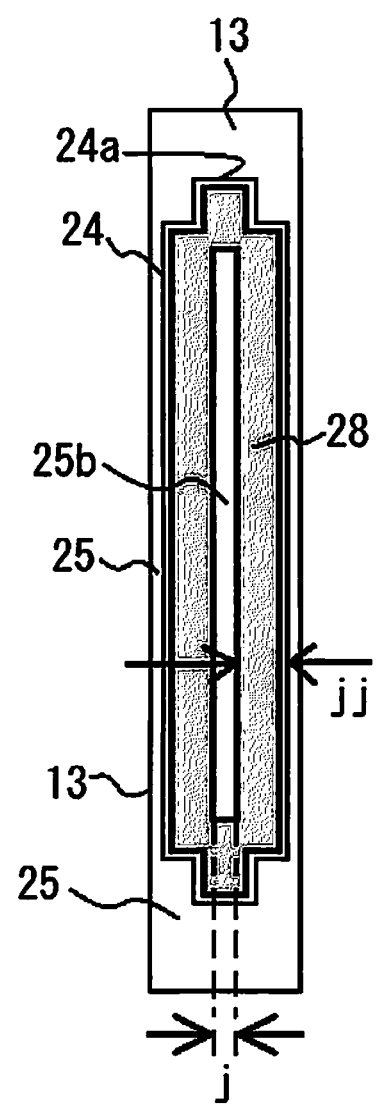
FIG. 4 is a schematic plan view of the main components of the semiconductor laser element according to Embodiment 2.

With the semiconductor laser element in Embodiment 2, the semiconductor stack 12 is stacked over the substrate 11, and the ridge 13 is formed as shown in FIG. 4 on the surface of the semiconductor stack 12. A first electrode layer 24 having electrode protrusion portions 24a is formed on the ridge 13.

A current injection prevention layer 25 is disposed on the first electrode layer 24. The current injection prevention layer 25 covers the upper surface near the edge of the first electrode layer 24 from the side surfaces of the first electrode layer 24, and also continuously covers the side surfaces of the ridge 13 and the entire upper surface of the semiconductor stack 12. The outer edges of the current injection prevention layer 25 coincide with the outer edges of the semiconductor stack 12, just as with the semiconductor laser element 10 in Embodiment 1.

The current injection prevention layer 25 has an island portion 25b disposed over the center region of the ridge 13 in plan view.

As shown in FIG. 4, The width j of the island portion 25b of the current injection prevention layer 25 is 10 µm, and the length in the lengthwise direction is 1087 µm.

The current injection prevention layer 25 is separated at the distance jj of 17 µm from each end of the first electrode 24 which is covered with the current injection prevention layer 25 and is disposed on the upper surface near the edges extending in the lengthwise direction of the first electrode layer 24.

This current injection prevention layer 25 is in contact with the first electrode layer 24 at 27.1% of the planar surface area of the first electrode layer 24.

Other than the shape of the current injection prevention layer 25 discussed above, the configuration of the semiconductor laser element in Embodiment 2 is substantially the same as that of the semiconductor laser element 10 in Embodiment 1.

Embodiment 3

Figure 5:
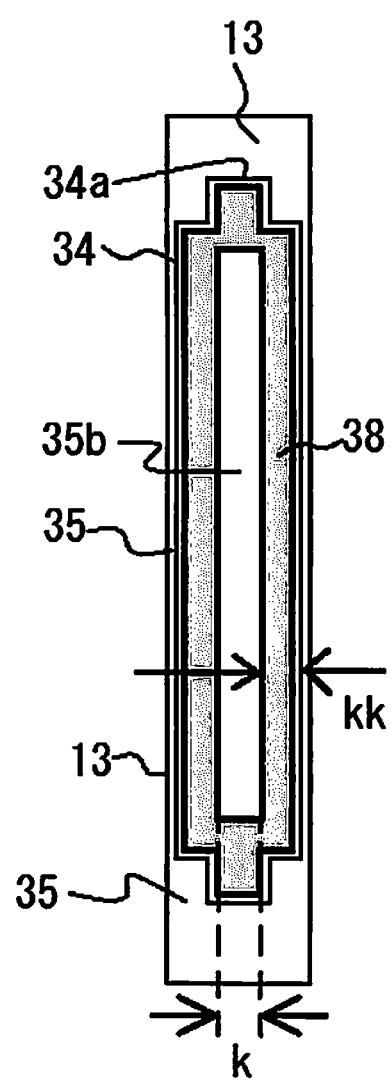
FIG. 5 is a schematic plan view of the main components of the semiconductor laser element according to Embodiment 3.

As shown in FIG. 5, with the semiconductor laser element in Embodiment 3, a first electrode layer 34 having electrode protrusion portions 34a is formed on the ridge 13. A current injection prevention layer 35 is disposed on the first electrode layer 34.

The current injection prevention layer 35 covers the upper surface near the edges of the first electrode layer 34 from the side surfaces of the first electrode layer 34, and also continuously covers the side surfaces of the ridge 13 and the entire upper surface of the semiconductor stack 12. The outer edges of the current injection prevention layer 35 coincide with the outer edges of the semiconductor stack 12, just as with the semiconductor laser element 10 in Embodiment 1. The current injection prevention layer 35 has an island portion 35b disposed over the center region of the ridge 13 in plan view.

As shown in FIG. 5, The width k of the island portion 35b of the current injection prevention layer 35 is 18 µm, and the length in the lengthwise direction is 1087 µm.

The current injection prevention layer 35 is separated at the distance kk of 13 µm from each end of the first electrode 34 which is covered with the current injection prevention layer 25 and is disposed on the upper surface near the edges extending in the lengthwise direction of the first electrode layer 34.

This current injection prevention layer 35 is in contact with the first electrode layer 34 at 47.4% of the planar surface area of the first electrode layer 34.

Other than the shape of the current injection prevention layer 25 discussed above, the configuration of the semiconductor laser element in Embodiment 3 is substantially the same as that of the semiconductor laser element 10 in Embodiment 1.

Embodiment 4

Figure 6:
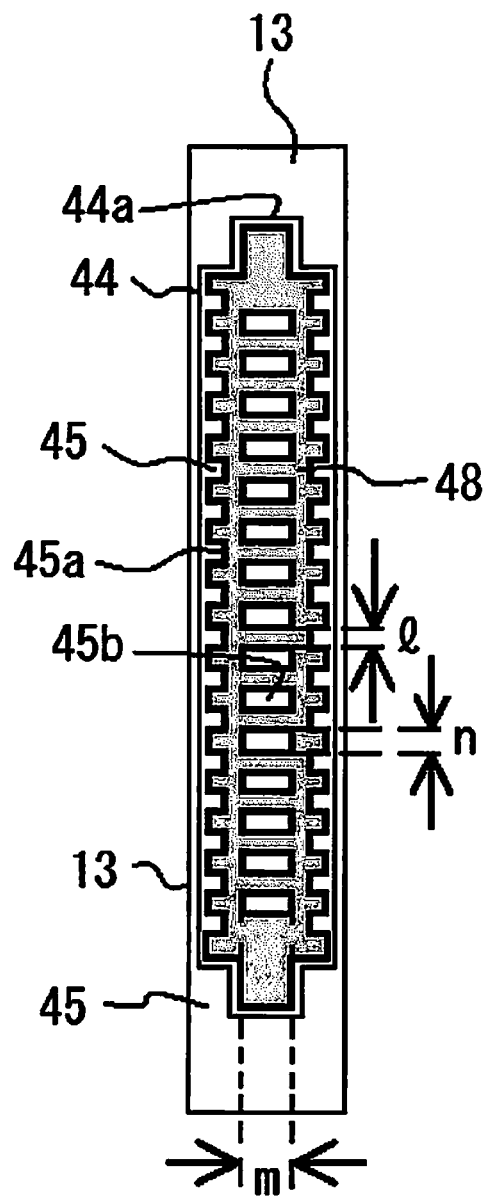
FIG. 6 is a schematic plan view of the main components of the semiconductor laser element according to Embodiment 4.

As shown in FIG. 6, with the semiconductor laser element in Embodiment 4, a first electrode layer 44 having electrode protrusion portions 44a is formed on the ridge 13. A current injection prevention layer 45 is disposed on the first electrode layer 44.

The current injection prevention layer 45 covers the upper surface near the edges of a first electrode layer 44 from the side surfaces extending in the lengthwise direction of the first electrode layer 44, and also continuously covers the side surfaces of the ridge 13 and the entire upper surface of the semiconductor stack 12.

The current injection prevention layer 45 has protrusion portions 45a that extend from both edges extending in the lengthwise direction of the first electrode layer 44 toward the center region of the ridge 13 in plan view. The protrusion portions 45a are separated in the lengthwise direction.

Furthermore, the current injection prevention layer 45 has island portions 45b in the center region of the ridge 13 in plan view, and the island portions 45b are separated in the lengthwise direction.

The island portions 45b are disposed between the protrusion portions 45a in the lengthwise direction, and are disposed in the center portion of the current injection prevention layer in the short-side direction. When the island portions 45b and the protrusion portions 45a are thus both provided, the island portions 45b can be disposed between the protrusion portions 45a.

The spacing between the island portions 45b is 10 μm, the length n of the island portions 45b is 10 μm, and the width m of the island portions 45b is 20 μm.

This current injection prevention layer 45 is in contact with the first electrode layer 44 at 39.3% of the planar surface area of the first electrode layer 44.

Other than the shape of the current injection prevention layer 45 discussed above, the configuration of the semiconductor laser element in Embodiment 4 is substantially the same as that of the semiconductor laser element 10 in Embodiment 1.

Embodiment 5

Figure 7:
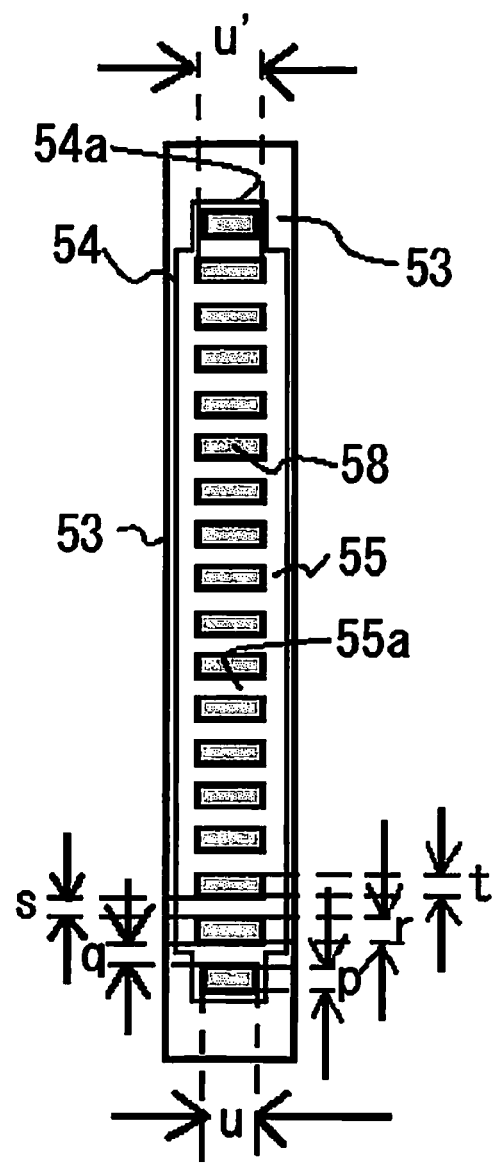
FIG. 7 is a schematic plan view of the main components of the semiconductor laser element according to Embodiment 5.

With the semiconductor laser element in Embodiment 5, the semiconductor stack 12 is stacked over the substrate 11, and a ridge 53 is formed as shown in FIG. 7 on the surface of the semiconductor stack 12. A first electrode layer 54 is formed on the ridge 53. The ridge 53 is formed as a stripe having a width of 35 μm.

The first electrode layer 54 is formed on the ridge 53 in a width that is slightly narrower than the ridge 53. The first electrode layer 54 has electrode protrusion portions 54a that protrude in the lengthwise direction. The length of these electrode protrusion portions 54a is 30 μm, and their width is 15 μm.

A current injection prevention layer 55 is disposed on the first electrode layer 54. The current injection prevention layer 55 covers the upper surface near the edge of the first electrode layer 54 from the side surfaces of the first electrode layer 54, and also continuously covers the side surfaces of the ridge 53 and the entire upper surface of the semiconductor stack 12.

The current injection prevention layer 55 has protrusion portions 55a in a shape that is linked from one edge extending in the lengthwise direction of the first electrode layer 54 to the other. The protrusion portions 55a are separated in the lengthwise direction.

The width of the protrusion portions 55a is 29 μm between the two edges extending in the lengthwise direction of the first electrode layer 54. The width u' of a current injection region is 17 μm. The spacing t of the electrode protrusion portions 55a is 16 μm, and their length s is 16 μm. However, the spacing r of the portion closest to the electrode protrusion portion 54a is 15.5 μm.

At the sites corresponding to the electrode protrusion portions 54a of the first electrode layer 54, the spacing p between the protrusion portions 55a is 15 μm, their length q is 15 μm, and the width u of the current injection region 58 is 12 μm. The protrusion portion 55a closest to the end is disposed at the connection with the internal regions of the electrode protrusion portions 54a.

This current injection prevention layer 55 is in contact with the first electrode layer 54 at 72.7% of the planar surface area of the first electrode layer 54.

Other than the shape of the current injection prevention layer 55 discussed above, the configuration of the semiconductor laser element in Embodiment 5 is substantially the same as that of the semiconductor laser element 10 in Embodiment 1.

Embodiment 6

Figure 8:
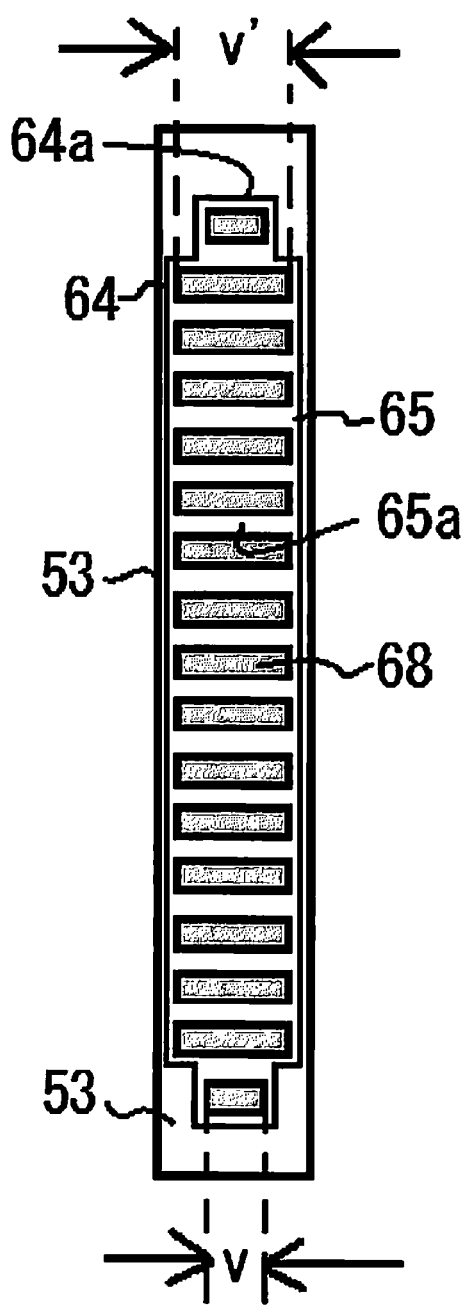
FIG. 8 is a schematic plan view of the main components of the semiconductor laser element according to Embodiment 6.

As shown in FIG. 8, with the semiconductor laser element in this embodiment, a current injection prevention layer 65 covers part of the upper surface of a first electrode layer 64 from the side surfaces of the first electrode layer 64, and also continuously covers the side surfaces of the ridge 53 and the entire upper surface of the semiconductor stack 12.

The current injection prevention layer 65 has protrusion portions 65a in a shape that is linked from one edge extending in the lengthwise direction of the first electrode layer 64 to the other. The protrusion portions 65a are separated in the lengthwise direction.

The width of the protrusion portions 65a is 29 μm between the two edges extending in the lengthwise direction of the first electrode layer 64. The width v' of a current injection region 68 is 29 μm. At the sites corresponding to the electrode protrusion portions 64a of the first electrode layer 64, the width v of the current injection region 68 is 12 μm.

This current injection prevention layer 65 is in contact with the first electrode layer 64 at 54.1% of the planar surface area of the first electrode layer 64.

Other than the shape of the current injection prevention layer 65 discussed above, the configuration of the semiconductor laser element in Embodiment 6 is substantially the same as that of the semiconductor laser element in Embodiment 1 or Embodiment 5.

Evaluation

Figure 9A:
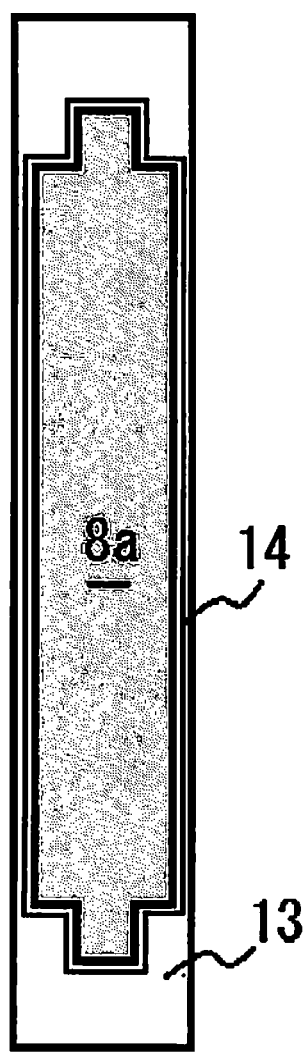
FIG. 9A is a schematic plan view of a semiconductor laser element according to Comparative Example 1.
Figure 9B:
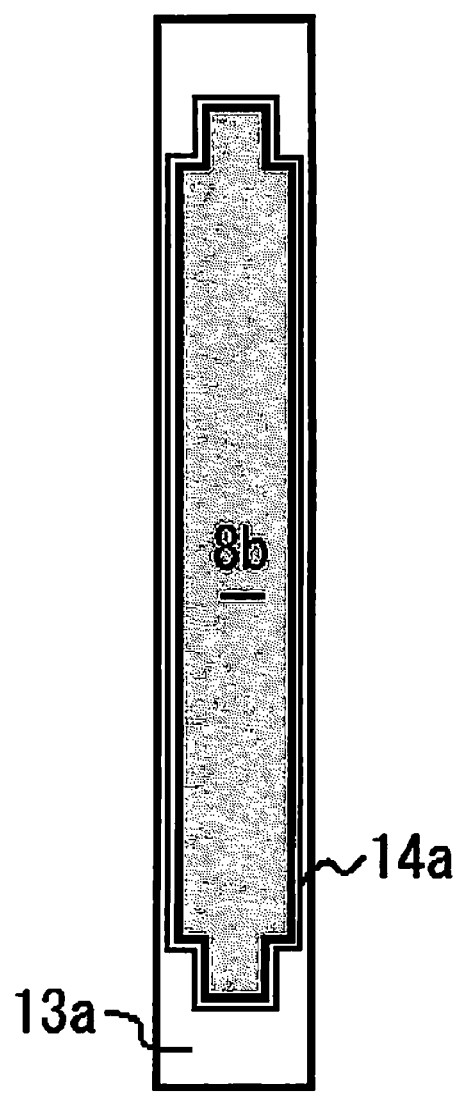
FIG. 9B is a schematic plan view of semiconductor laser element according to Comparative Example 2.

To evaluate the performance of the semiconductor laser elements in Embodiments 1 to 6, first semiconductor laser elements of Comparative Examples 1 and 2 shown in FIGS. 9A and 9B were prepared as comparative examples.

As shown in FIG. 9A, the semiconductor laser element of Comparative Example 1 has the same configuration as the semiconductor laser element 10 in Embodiment 1, except that no protrusion portion is provided on the current injection prevention layer over the first electrode layer 14 on the ridge 13 (50 μm wide), and a current injection region 8a that is straight in its lengthwise direction and has a width of 44 μm is used. The width of the current injection region 8a at the electrode protrusion portion is 22 μm. The current injection region 8a accounts for 6.8% of the planar surface area of the first electrode layer 14.

As shown in FIG. 9B, the semiconductor laser element in Comparative Example 2 has the same configuration as the semiconductor laser element 10 in Embodiment 5, except that no protrusion portion is provided on the current injection prevention layer over the first electrode layer 14 on the ridge 13a (35 μm wide), and a current injection region 8a that is straight in its lengthwise direction and has a width of 29 μm is used. The width of the current injection region 8a at the electrode protrusion portion is 12 μm. The current injection region 8a accounts for 9.4% of the planar surface area of the first electrode layer 14.

FIGS. 10B, 10E, 10H, 10K, 11B, and 11E show the power conversion efficiency when a current of 3.0 A was sent by CW drive (continuous drive) to each of the semiconductor laser elements. These graphs show the normal probability distribution after finding the power conversion efficiency for a plurality of semiconductor laser elements obtained from a single wafer. In these graphs, data is plotted using the horizontal axis as the cumulative probability. Gray circles show the results for the semiconductor laser elements in Comparative Examples 1 and 2, while black triangles show the results for the semiconductor laser elements in Embodiments 1 to 6.

FIGS. 10A, 10D, 10G, 10J, 11A, and 11D are schematic representations of the current injection region in Embodiments 1 to 6, and correspond to FIGS. 10B, 10E, 10H, 10K, 11B, and 11E, respectively.

In FIGS. 10B, 10E, 10H, 10K, 11B, and 11E, the values at a cumulative probability of 50% (that is, the median values) were compared, and the percentage decrease in the power conversion efficiency of the semiconductor laser elements in Embodiments 1 to 4 with respect to the semiconductor laser element of Comparative Example 1 were found to be 0.2%, 0.2%, 0.8%, and 0.4%, respectively. In every case the percentage decrease was confirmed to fall within a range of 1% or less. In particular, with the semiconductor laser elements in Embodiments 1, 2, and 4, in which the current injection prevention layer was disposed over the first electrode layer at a suitable location, it was confirmed that power conversion efficiency was ensured which was substantially the same as when no current injection prevention layer was disposed.

In these graphs, a comparison of the median values reveals that the percentage decrease in the power conversion efficiency of the semiconductor laser elements in Embodiments 5 and 6 with respect to semiconductor laser element of Comparative Example 2 was 1.7% and 0.5%, respectively. The percentage decrease is somewhat greater than in Embodiments 1, 2, and 4, but it was confirmed that in both cases the decrease in the power conversion efficiency was suppressed by providing the current injection prevention layers 55 and 65.

Figure 10A:
FIG. 10A is a schematic plan view of the main components of the semiconductor laser element according to Embodiment 1.
Figure 10B:
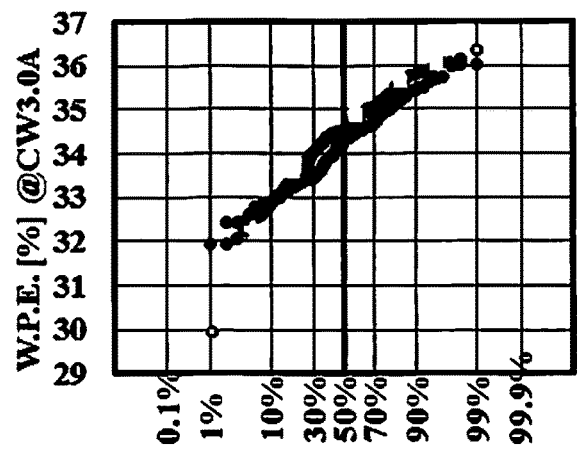
FIGS. 10B and 10C are graphs of the evaluation of the semiconductor laser element according to Embodiment 1.
Figure 10C:
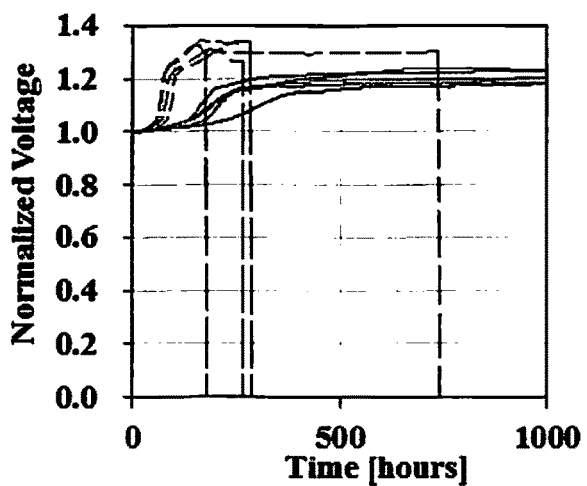
Figure 10D:
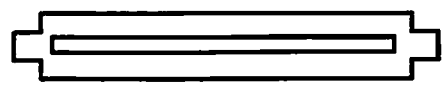
FIG. 10D is a schematic plan view of the main components of the semiconductor laser element according to Embodiment 2.
Figure 10E:
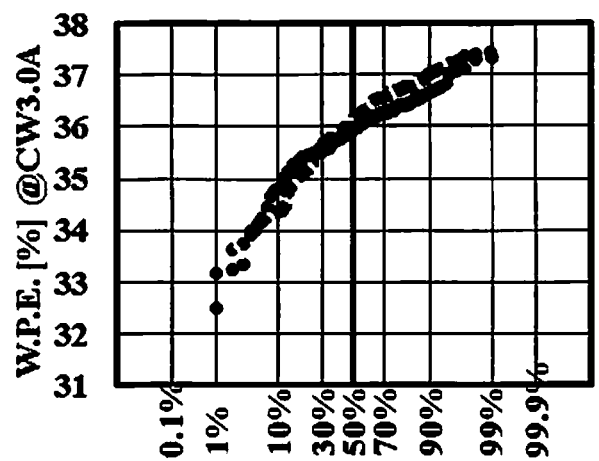
FIGS. 10E and 10F are graphs of the evaluation of the semiconductor laser element according to Embodiment 2.
Figure 10F:
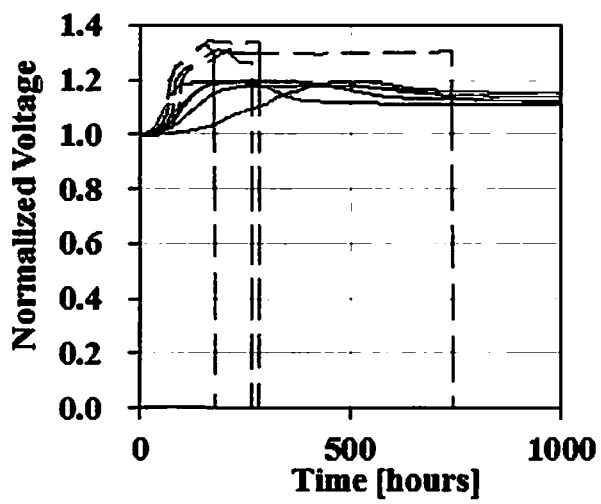
Figure 10G:
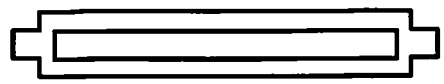
FIG. 10G is a schematic plan view of the main components of the semiconductor laser element according to Embodiment 3.
Figure 10H:
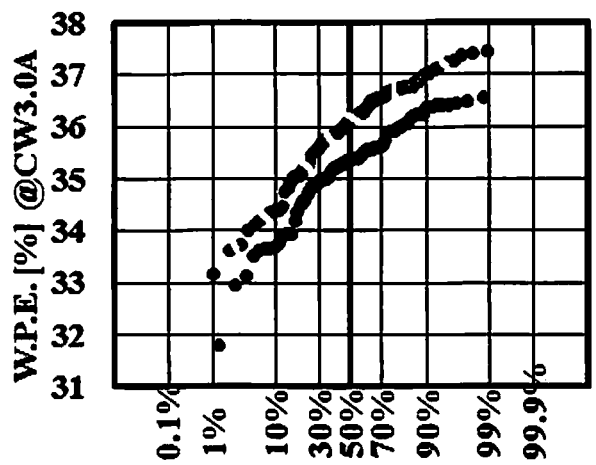
FIGS. 10H and 10I are graphs of the evaluation of the semiconductor laser element according to Embodiment 3.
Figure 10I:
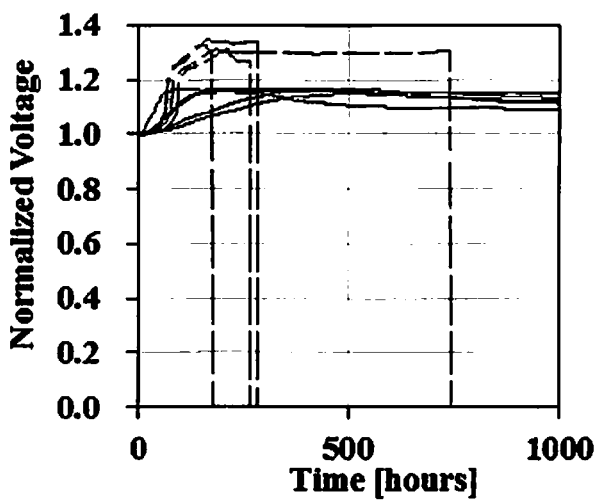
Figure 10J:
FIG. 10J is a schematic plan view of the main components of the semiconductor laser element according to Embodiment 4.
Figure 10K:
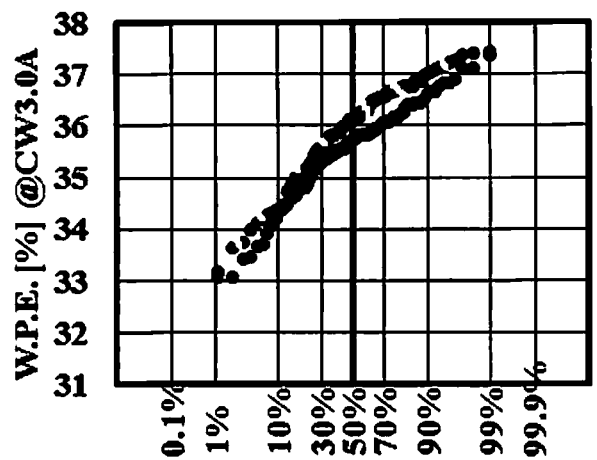
FIGS. 10K and 10L are graphs of the evaluation of the semiconductor laser element according to Embodiment 4.
Figure 10L:
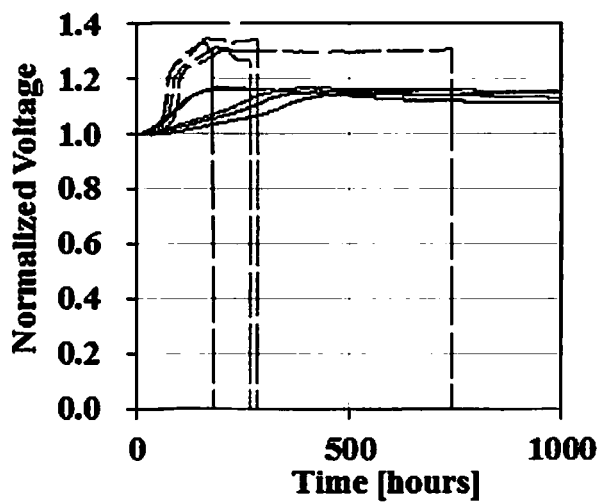
Figure 11A:
FIG. 11A is a schematic plan view of the main components of the semiconductor laser element according to Embodiment 5.
Figure 11B:
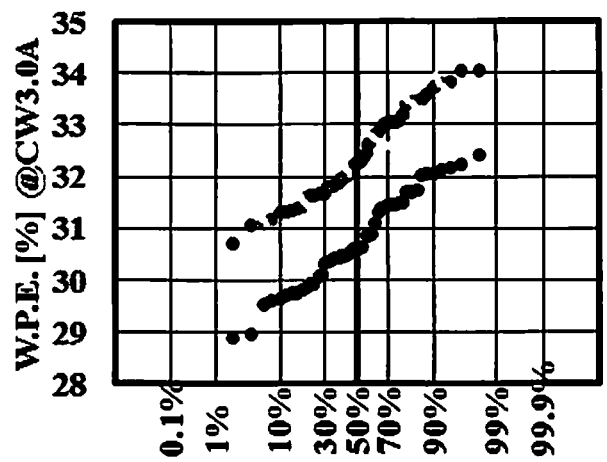
FIGS. 11B and 11C are graphs of the evaluation of the semiconductor laser element according to Embodiment 5.
Figure 11C:
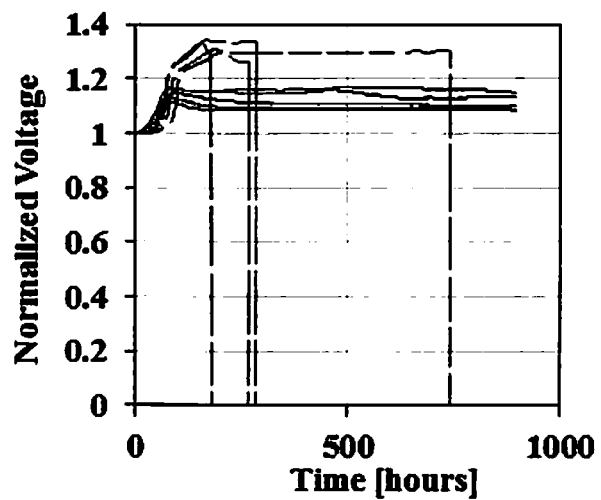
Figure 11D:
FIG. 11D is a schematic plan view of the main components of the semiconductor laser element according to Embodiment 6.
Figure 11E:
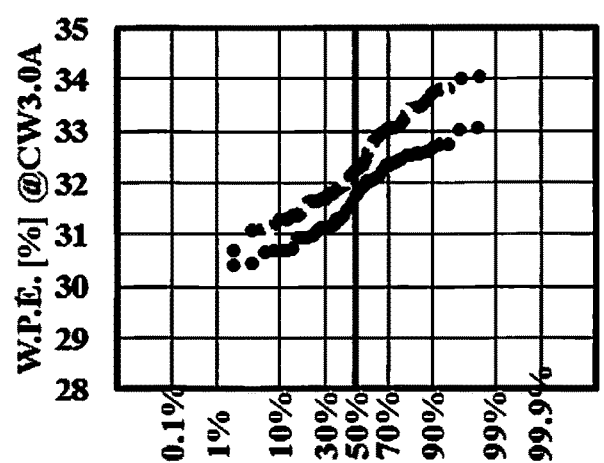
FIGS. 11E and 11F are graphs of the evaluation of the semiconductor laser element according to Embodiment 6.
Figure 11F:
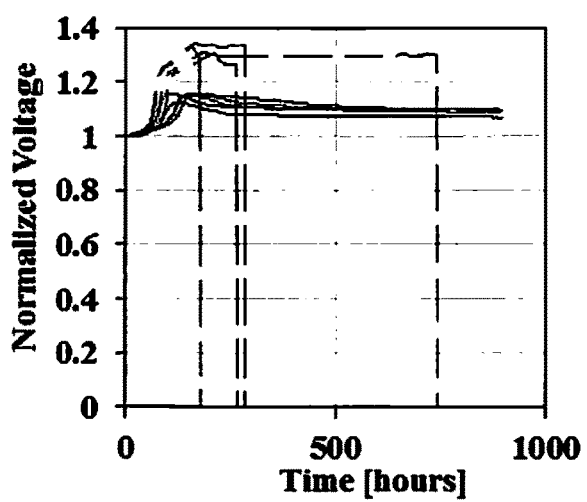

In FIGS. 10E, 10H and 10K the values for Comparative Example 1 differ somewhat from that in FIG. 10B, but this is because the production lot for Embodiment 1 and Comparative Example 1 in FIG. 10B was different from the production lots for Embodiments 2 to 4 and Comparative Example 1 in FIGS. 10E, 10h, and 10K. The materials and dimensions are the same in every Comparative Example 1.

FIGS. 10C, 10F, 10I, 10L, 11C, and 11F show the results when voltage continued to be applied until each semiconductor laser element was no longer lit, and the voltage continued to be applied even after this, at various lengths of time since the element stopping being lit. The point when the element went out is indicated as 0 hours, and the vertical axis shows normalized values in which the voltage at each time period was divided by the voltage at 0 hours. The broken lines show the results for the semiconductor laser elements in Comparative Example 1, and the solid lines show the results for the semiconductor laser elements in Embodiments 1 to 6.

FIGS. 10A, 10D, 10G 10J, 11A, and 11D are schematic representations of the current injection region in Embodiments 1 to 6, and correspond to FIGS. 10C, 10F, 10I, 10L, 11C, and 11F, respectively. In these graphs, comparison was made only to the semiconductor laser elements in Comparative Example 1.

As shown in FIGS. 10C, 10F, 10I, 10L, 11C, and 11F, with the semiconductor laser elements in Comparative Example 1, first one of them went to a voltage value of zero after around 180 hours had elapsed, and all four went to a voltage value of zero by the time 750 hours had elapsed. The state of a voltage value of zero shows a state that the semiconductor laser element cannot maintain a stable voltage characteristic and the current cannot be passed through the semiconductor laser element. When power continues to be sent to the semiconductor laser element, physical failure of the semiconductor stack proceeds, and eventually the semiconductor laser element becomes discontinuous. On the other hand, when voltage was similarly applied continuously to a plurality of the semiconductor laser elements in Embodiments 1 to 6, none went to a voltage value of zero even after 800 hours, and voltage could continue to be applied. With the semiconductor laser elements in Embodiments 1 to 4, voltage continued to be applied up to 1000 hours, and up to 900 hours with the semiconductor laser elements in Embodiments 5 and 6, but none went to a voltage value of zero.

It was confirmed from these results that, in contrast to the semiconductor laser elements in Comparative Example 1, the semiconductor laser elements in all of the embodiments could undergo the continuous application of voltage to the laser element for at least 800 hours without going to a voltage value of zero. That is, it was confirmed that the semiconductor laser elements in all of the embodiments could not become discontinuous even after 800 hours.

The semiconductor laser element of the embodiments of the present disclosure can be used for a laser element which is used for wide varieties light sources in addition to a light source for the projector.

What is claimed is:
1. A semiconductor laser element comprising:
a semiconductor stack with a ridge, the semiconductor stack having an emission surface and a reflection surface;
a first electrode layer extending in the lengthwise direction and disposed on the ridge in contact with the semiconductor stack;
a current injection prevention layer partially covering the first electrode layer, and having one or more island portions, each of the island portions being disposed in a center region of the ridge in plan view; and
a second electrode layer disposed on the current injection prevention layer, and partially in contact with the first electrode layer.

2. The semiconductor laser element according to claim 1, wherein
the one or more island portions is separated from an end on an emission surface side of the first electrode layer.

3. The semiconductor laser element according to claim 1, wherein
the width of the ridge is about 10 to 100 μm.

4. The semiconductor laser element according to claim 1, wherein
the current injection prevention layer is in contact with the first electrode layer at 18 to 80% of a contact surface area between the first electrode layer and the semiconductor stack.

5. The semiconductor laser element according to claim 4, wherein
the second electrode layer is in contact with the first electrode layer at 30 to 82% of the contact surface area between the first electrode layer and the semiconductor stack.

6. The semiconductor laser element according to claim 1, wherein
the one or more island portions of the current injection prevention layer includes a single island portion with a length of about 70 to 95% of the length of the first electrode layer.

7. The semiconductor laser element according to claim 6, wherein
a width of the single island portion is about 40 to 80% of the width of the first electrode layer.

8. The semiconductor laser element according to claim 1, wherein
the one or more island portions of the current injection prevention layer includes a plurality of island portions, and a total length of the island portions is a length of about 30 to 70% of the length of the first electrode layer.

9. The semiconductor laser element according to claim 8, wherein
a width of each of the plurality of island portions is about 40 to 80% of the width of the first electrode layer.

* * * * *